US008304063B2

(12) United States Patent
Ito et al.

(10) Patent No.: US 8,304,063 B2
(45) Date of Patent: Nov. 6, 2012

(54) DIAMOND-LIKE CARBON FILM FOR SLIDING PARTS AND METHOD FOR PRODUCTION THEREOF

(75) Inventors: Hirotaka Ito, Kobe (JP); Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 38 days.

(21) Appl. No.: 12/325,432

(22) Filed: Dec. 1, 2008

(65) Prior Publication Data

US 2009/0186206 A1 Jul. 23, 2009

(30) Foreign Application Priority Data

Jan. 21, 2008 (JP) ................................ 2008-010504

(51) Int. Cl.
*B32B 9/00* (2006.01)
*B32B 7/02* (2006.01)

(52) U.S. Cl. ........ 428/217; 428/212; 428/216; 428/336; 428/408; 427/249.7

(58) Field of Classification Search .................. 428/408, 428/212, 217, 216, 336; 427/249.7
See application file for complete search history.

(56) References Cited

U.S. PATENT DOCUMENTS 5,989,672 A * 11/1999 Hayashi ..................... 428/833.2
6,071,597 A * 6/2000 Yang et al. ..................... 428/209
6,277,480 B1 * 8/2001 Veerasamy et al. ........... 428/217
6,312,808 B1 * 11/2001 Veerasamy et al. ........... 428/408
6,562,445 B2 * 5/2003 Iwamura ....................... 428/217
7,172,343 B2 * 2/2007 Kinno et al. .................. 384/492
7,255,084 B2 * 8/2007 Savale et al. ............... 123/193.6
7,368,168 B2 * 5/2008 Mori et al. .................... 428/408

FOREIGN PATENT DOCUMENTS

JP 5-117087 5/1993
JP 8-193270 7/1996
JP 2000-256850 9/2000
JP 2003-268571 9/2003
JP 2004-10923 1/2004
JP 2007-31797 2/2007
WO WO 2007/020139 2/2007

OTHER PUBLICATIONS

U.S. Appl. No. 12/720,135, filed Mar. 9, 2010, Ito, et al.
Extended Search Report (including the Search Opinion), issued Nov. 17, 2010, in European Patent Application No. 09150933.1, filed Jan. 20, 2009.
U.S. Appl. No. 13/145,348, filed Jul. 20, 2011, Ito, et al.

* cited by examiner

*Primary Examiner* — Cathy Lam
(74) *Attorney, Agent, or Firm* — Oblon, Spivak, McClelland, Maier & Neustadt, L.L.P.

(57) ABSTRACT

A diamond-like carbon film for sliding parts which is applied to the sliding surface of sliding parts, the diamond-like carbon film including at least two layers, one being a lower layer of diamond-like carbon (referred to as DLC hereinafter) and the other being an upper layer of DLC placed thereon, wherein the lower layer has a hardness no lower than 20 GPa and no higher than 45 GPa, a Young's modulus no lower than 250 GPa and no higher than 450 GPa, and a thickness no smaller than 0.2 μm and no larger than 4.0 μm, and the upper layer has a hardness no lower than 5 GPa and lower than 20 GPa, a Young's modulus no lower than 60 GPa and no higher than 240 GPa, and a thickness no smaller than 1.0 μm and no larger than 10 μm. The diamond-like carbon film has both good durability and low frictional coefficient.

11 Claims, No Drawings

DIAMOND-LIKE CARBON FILM FOR SLIDING PARTS AND METHOD FOR PRODUCTION THEREOF

BACKGROUND OF THE INVENTION

1. Field of the Invention

The present invention relates to diamond-like carbon film (DLC film for short hereinafter) and a method for production thereof. Because of its good durability and low frictional coefficient, DLC film is used as hard coating film that is applied to sliding parts, such as automotive cams and shims, which slide over surfaces between two parts in contact with each other. The present invention relates also to a sliding part coated with such hard coating film.

2. Description of the Related Art

DLC film to be applied to the surfaces of sliding parts should have several important characteristics, one of which is good adhesion to the substrate. Many inventions (mentioned later) have been disclosed about improvement in adhesion from the standpoint of the composition and forming method of DLC film.

Patent Document 1 is concerned with a protective film for recording media which is formed by plasma CVD. This protective film has a disadvantage of requiring an intermediate layer thereunder if the substrate is stainless steel for which a thick DLC film is not suitable. The intermediate layer containing carbon is intended to improve adhesion between the DLC film and the substrate.

Patent Document 2 is concerned with a nitrogen-containing chromium film, which is intended to improve adhesion between DLC and a substrate of alloy steel. This idea was conceived to overcome weak adhesion due to difference in hardness, expansion coefficient, and structure between the substrate and the DLC film. (The DLC film in this case includes the one composed of hard and soft layers placed one over another.)

Patent Document 3 is concerned with articles with a protective DLC film. This DLC film is intended to eliminate pretreatment, such as ion etching, which is necessary to provide a high bonding force to the DLC film in the case where the substrate is steel, alloy, glass, or ceramics. The object of improving adhesion is achieved by forming an intermediate layer by ionization vapor deposition. This intermediate layer has a hardness of 1000 to 5000 Hv, so that it is softer than the substrate and harder than the DLC film.

Patent Document 4 is concerned with a multi-layered structure for improved wear resistance and adhesion, which is composed of a metal layer, a metal/carbon gradient layer, and a DLC layer having a region in which hardness varies. This idea was conceived to eliminate difficulties in providing a strong, sound DLC film, which was not achieved by the conventional W-containing DLC layer or amorphous carbon to exhibit good wear resistance and adhesion for sliding parts.

Patent Document 5 is concerned with a composite hard coating film composed of intermediate layers of nitride, oxide, and carbide (which are formed by PVD), a layer of Si compound, and a layer of Si-containing DLC. This composite coating film both improves adhesion and lowers frictional coefficients.

The technologies of DLC film disclosed in these Patent Documents have in common one object of improving adhesion with the substrate. However, all of them have the following problems in view of the technical background of the present invention.

The inventions disclosed in Patent Documents 1, 2, or 3 propose the metal layer or the gradient structure of metal and carbon layer for improvement in adhesion. The intermediate layer of such structure is effective for good adhesion but has a low hardness. Therefore, when used under a high contact pressure, the coating film breaks at that part of the intermediate layer which undergoes plastic deformation. This poses a problem with durability.

The invention disclosed in Patent Document 4 is intended to improve adhesion by providing an intermediate layer which has a region in which hardness varies. This structure inevitably contains a region in which hardness is low; therefore, it poses a problem with durability for use under a high contact pressure of sliding.

The invention disclosed in Patent Document 5, which is concerned with a method for forming intermediate layers of nitride, oxide, and carbide by PVD, and subsequently forming thereon a layer of Si compound and an Si-containing DLC layer, has a disadvantage of requiring a long processing time because of increased steps even though each intermediate layer can be adjusted for hardness.

Patent Document 1:
Japanese Patent Laid-open No. 2000-256850
Patent Document 2:
Japanese Patent Laid-open No. 2007-31797
Patent Document 3:
Hei-5-117087
Patent Document 4:
Japanese Patent Laid-open No. 2004-10923
Patent Document 5:
Japanese Patent Laid-open No. 2003-268571

OBJECT AND SUMMARY OF THE INVENTION

The present invention was completed from a standpoint different from the conventional technology mentioned above. It is an object of the present invention to provide DLC sliding film which exhibits good durability as well as low frictional coefficients, and also to provide sliding parts coated therewith. It is another object of the present invention to provide a method for producing the sliding film easily and industrially.

The present invention to achieve the above-mentioned objects covers each of the following aspects.

(1) A diamond-like carbon film for sliding parts which is applied to the sliding surface of sliding parts, the diamond-like carbon film including at least two layers, one being a lower layer of diamond-like carbon (referred to as DLC hereinafter) and the other being an upper layer of DLC placed thereon, wherein the lower layer has a hardness no lower than 20 GPa and no higher than 45 GPa, a Young's modulus no lower than 250 GPa and no higher than 450 GPa, and a thickness no smaller than 0.2 μm and no larger than 4.0 μm, and the upper layer has a hardness no lower than 5 GPa and lower than 20 GPa, a Young's modulus no lower than 60 GPa and no higher than 240 GPa, and a thickness no smaller than 1.0 μm and no larger than 10 μm.

(2) The diamond-like carbon film for sliding parts as defined in the first aspect, wherein the upper layer is one which is formed by chemical vapor deposition (referred to as CVD hereinafter) and the lower layer is one which is formed by physical vapor deposition (PVD).

(3) A sliding part having its sliding surface coated with at least two layers, one being a lower layer of DLC and the other being an upper layer of DLC placed thereon, wherein the lower layer has a hardness no lower than 20 GPa and no higher than 45 GPa, a Young's modulus no lower than 250 GPa and no higher than 450 GPa, and a thickness no smaller than 0.2 μm and no larger than 4.0 μm, and the upper layer has a hardness no lower than 5 GPa and lower than 20 GPa, a Young's modulus no lower than 60 GPa and no higher than 240 GPa, and a thickness no smaller than 1.0 μm and no larger than 10 μm.

(4) The sliding part as defined in the third aspect, wherein the upper layer of DLC is one which is formed by CVD and the lower layer of DLC is one which is formed by PVD.

(5) A method for producing a diamond-like carbon film for sliding parts, the method including a step of forming on a sliding part a lower layer of DLC by PVD and a step of forming thereon an upper layer of DLC by CVD.

EFFECT OF THE INVENTION

The present invention is concerned with a diamond-like carbon film of double-layered structure to be applied to sliding parts. Both of the two layers are of diamond-like carbon but differ in hardness, Young's modulus, and thickness within specific ranges. Therefore, the diamond-like carbon film has improved durability and low frictional coefficients.

The diamond-like carbon film according to the present invention can be applied to various sliding parts including automotive parts, machine parts, tools, and dies. The sliding parts may be those which are made of metallic materials, such as steel, aluminum, and cemented carbide, as well as non-metallic materials such as ceramics.

The sliding film according to the present invention is characterized by double-layer structure, both layers being diamond-like carbon film. It may be applied to either or both of sliding parts depending on lubricating and sliding conditions.

The DLC film of the present invention is composed of at least two layers, one being a lower layer in contact with the sliding surface of a sliding part and the other being an upper layer formed on the lower layer. These layers can be easily formed on the substrate by PVD (such as sputtering) that employs a carbon target and CVD that employs a hydrocarbon gas as a raw material. PVD forms a DLC film having a high hardness, and CVD forms a DLC film having a low hardness. The DLC film formed by CVD has a low hardness owing to hydrogen atoms captured from the raw material gas, but offers an advantage of reducing frictional coefficients. On the other hand, CVD is superior to PVD in the film-forming rate. Therefore, the DLC layers according to the present invention are formed under adequate conditions in consideration of these merits and demerits, so that they exhibit the desired characteristic properties.

The best result is attained if the lower layer of DLC film is formed by PVD and the upper layer of DLC film is formed by CVD, so that the lower layer has so high a harness as to resist plastic deformation under a high contact pressure and the upper layer has a low frictional coefficient. The thus obtained sliding film has good durability as well as low frictional coefficients.

The PVD process to grow the lower layer of DLC film includes sputtering (mentioned above), arc ion plating (AIP), and laser arc ion plating. The first method is most desirable because the second and third methods tend to give a film with a larger film stress as compared with the first method and they also present difficulties in controlling the film thickness over a wide range.

According to the present invention, the double-layer structure of DLC film is characterized in that the lower layer has a hardness no lower than 20 GPa and a Young's modulus no lower than 250 GPa. If these requirements are not met, the lower layer formed by PVD undergoes plastic deformation when it is subjected to a high contact pressure under severe sliding conditions. Such plastic deformation causes cracking which eventually peels off the film and deteriorates durability.

However, with an excessively high hardness, the lower layer increases in internal stress and decreases in brittle resistance. Therefore, the lower layer should have a hardness no higher than 45 GPa, preferably no higher than 40 GP, and a Young's modulus no higher than 450 GPa, preferably no higher than 400 GPa.

The hardness and Young's modulus of the lower layer can be increased usually by raising the bias voltage; therefore, it is possible to adjust them easily by controlling the bias voltage.

According to the present invention, the upper layer (or outer layer) of the double-layer film is characterized in having a hardness lower than 20 GPa and a Young's modulus lower than 250 GPa. The one not meeting this requirement has a high frictional coefficient when measured by sliding tests in air, water, and oil. The lower the hardness, the lower the frictional coefficient. Therefore, the preferred hardness and Young's modulus are no higher than 18 GPa and no higher than 230 GPa, respectively. On the other hand, the lower the hardness, the faster the wearing rate. Therefore, the preferred hardness and Young's modulus are no lower than 5 GPa and no lower than 60 GPa, respectively, and more preferably no lower than 10 GPa and no lower than 120 GPa, respectively.

The upper layer can be formed easily by CVD. The hardness and Young's modulus of the upper layer can be controlled at a desired level of hardness and Young's modulus by adjusting the DC voltage and the partial pressure of gas for CVD.

The films of double-layered structure according to the present invention are composed of DLC. They are formed in the following manner. First, the lower layer of DLC having a high hardness and a high Young' modulus is formed by sputtering in a vacuum chamber. Sputtering is performed by using a solid carbon target and filling the vacuum chamber with Ar gas alone or a mixture gas of Ar and hydrocarbon (such as methane and acetylene). Then, the upper layer of DLC having a low frictional coefficient is formed by CVD on the lower layer of DLC (which has previously been formed). This CVD process employs hydrocarbon alone or a mixture of Ar and hydrocarbon.

Since the two layers are DLC films, there is no need to add targets or gases as in the case of forming nitrides, oxides, or carbides. Therefore, two kinds of DLC films can be formed continuously and efficiently in the same chamber.

The films of double-layered structure according to the present invention are characterized in having not only the specific hardness and Young's modulus mentioned above but also the specific thickness as mentioned below. In other words, the lower layer formed by PVD should have a thickness no smaller than 0.2 μm and no larger than 4.0 μm. With a thickness smaller than 0.2 μm, the lower layer receives the maximum stress which makes the substrate undergo plastic deformation. A preferred thickness is no smaller than 0.3 μm. With a thickness larger than 4.0 μm, the lower layer has a high internal stress which makes the layer brittle and poor in durability. A preferred thickness is no larger than 3.5 μm.

The upper layer formed by CVD should have a thickness no smaller than 1.0 μm and no larger than 10 μm. With a thickness smaller than 1.0 μm, it easily wears out in some environments because it has a low hardness. A preferred thickness is no smaller than 2.0 μm. By contrast, with a thickness larger than 10 μm, the upper layer is liable to peel off and hence is poor in durability due to internal stress even though it has a low hardness. Moreover, it takes a long time to form a film thicker than 10 μm by CVD although CVD is faster than PVD in the film-forming rate. Therefore, the preferred thickness is no larger than 8 μm from the standpoint of productivity.

Incidentally, the DLC film of double-layered structure may be modified by adding a layer (having a lower hardness) to the upper layer formed by CVD. This additional layer makes the upper layer more adaptive to friction or prevents the upper layer from increasing in frictional coefficient immediately after the start of sliding. It is also possible to place an intermediate layer between the lower DLC film (formed by PVD) and the substrate. This intermediate layer is formed from any of Cr, Ti, V, W, C, and compounds thereof. It prevents the peeling of the DLC film.

EXAMPLES

Various kinds of films were prepared and they were evaluated by measuring hardness, Young's modulus, and plastic deformation and also by carrying out sliding tests.

Measurement of Hardness and Young'S Modulus

Samples listed in Table 1 were prepared by coating a mirror-finished substrate of cemented carbide (UTi20T from Mitsubishi Material) with an underlying film (mentioned later) and lower and upper layers of DLC film specified in Table 1. The resulting samples were examined for hardness and Young's modulus.

The DLC films were formed by using a sputtering apparatus of unbalanced magnetron type (UBMS20 built by Kobe Steel Ltd.) which had been modified such that PVD (sputtering) and CVD can be carried out in the same chamber.

First, the substrate was placed in the chamber, which was subsequently evacuated to a pressure lower than $1\times10^{-3}$ Pa. The substrate was heated to about 400° C. and then subjected to sputter cleaning with Ar ions.

Then, the substrate was coated by PVD process with an underlying layer composed of a Cr layer and a Cr-C layer of gradient structure. This underlying layer is intended to ensure adhesion between the substrate and the DLC film. The underlayer film was formed in the following manner. The chamber was provided with a Cr target and a C target (for DLC film). First, a Cr film was formed for 2 minutes by application of an electric power of 1.0 kW. Then, sputtering was continued for a prescribed length of time, during which the electric power applied to the Cr target was gradually decreased from 1.0 kW to 0 kW and the electric power applied to the C target was gradually increased from 0 kW to 1.0 kW. In this way, there was obtained a film of gradient structure in which the lower portion is composed of 100% Cr and the upper portion (adjacent to the DLC layer to be formed later) is composed of 100% C, with the intermediate portion continuously changing in the Cr/C ratio in the thickness direction. The thus obtained underlying film was coated with the lower and upper layers of DLC shown in Table 1. Each of the layers has a thickness of 1 μm.

The PVD process was carried out under the following conditions.

Target: C target, 6 inches in diameter
Electric power: 1.5 kW (fixed)
Gas: mixture of Ar: $CH_4$=98:2
Total pressure of gas: 0.5 Pa
Bias voltage applied to the substrate: −20 to −250 V The varied bias voltage resulted in variation of hardness and Young's modulus as shown in Table 1.

On the other hand, the CVD process was carried out under the following conditions.

Gas: $C_2H_2$ (acetylene)
Pulse voltage: 400 V
Pressure of $C_2H_4$ gas: 1.0 to 8.2 Pa.

The varied gas pressure resulted in variation of hardness and Young's modulus as shown in Table 1.

The thus obtained DLC film was tested for hardness and Young's modulus by the nano-indentation method under the following conditions.

Apparatus: ENT-1100a, made by ELIONIX Ltd.
Indenter: Berkovich indenter made of diamond
Load: 10 to 100 mN
This test gave a load-unload curve, from which hardness and Young's modulus were calculated.

Measurement of Plastic Deformation

A mirror-finished substrate of cemented carbide (UTi20T from Mitsubishi Material) was sequentially coated with an underlying film (mentioned above) and the DLC film of double-layered structure as shown in Table 1. The DLC film was examined for the amount of plastic deformation. Incidentally, each layer of the DLC film was formed in the same way as that used for the samples for measurement of hardness and Young's modulus. PVD was carried out in the same chamber as used for CVD.

The testing for plastic deformation was carried out under the following conditions.

Apparatus: ENT-1100a, made by ELIONIX Ltd.
Indenter: Berkovich indenter made of diamond
Load: 1000 mN
This test gave a load-unload curve, from which the amount of plastic deformation was calculated.

Sliding Test

Samples for sliding test were prepared by coating a mirror-finished disk (SKD51, 34 mm in diameter and 15 mm in thickness) sequentially with an underlying layer (mentioned above) and the DLC film of double-layered structure as shown in Table 1 (the same one as used for measurement of plastic deformation). The resulting samples were examined for sliding performance.

Test conditions:
Specimen for sliding: non-coated ring of SKD51 (25.6 mm in outside diameter, 20.0 mm in inside diameter, 15.0 mm in thickness, R1.5 in curvature)
Rate of sliding: 1.0 m/s
Load: 200 N
Length of sliding: 5000 m
Lubricant for the disk: oil having a kinematic viscosity of about 10 $mm^2/s$ at room temperature.

Running-in was carried out for 10 minutes before the specified sliding rate and load were reached.

Durability was rated in terms of the seizure starting distance, which is defined as a sliding distance at which the frictional coefficient exceeded 0.3. Those specimens which did not suffer seizure after sliding over a distance of 5000 m were rated as "5000 m cleared". The frictional coefficient was expressed in terms of an average value in the sliding distance up to 5000 m (for specimens with a sliding distance exceeding 5000 m) or in terms of an average value in the sliding distance immediately before the frictional coefficient exceeded 0.3 (for specimens which suffered seizure).

Table 1 shows the results of measurements of hardness, Young's modulus, amount of plastic deformation, sliding performance, and overall rating. The symbols "O" and "x" in the column of overall rating denote respectively those samples which are superior in all of plastic deformation, durability, and frictional coefficient, and those samples which are poor in any one of these properties.

It is noted from Table 1 that sample No. 1, which has only the lower layer formed by PVD, had a large frictional coefficient, and sample No. 2, which has only the upper layer formed by CVD, had a low frictional coefficient but suffered remarkable plastic deformation and seizure and was poor in durability.

Sample No. 3, which has an excessively thin lower layer, suffered remarkable plastic deformation.

Sample No. 5 had a high frictional coefficient because the surface layer has a high hardness. By contrast, Sample No. 6 had a large amount of plastic deformation because the lower layer has a low hardness.

Samples No. 7 suffered seizure because the surface layer worn off soon and the lower layer formed by PVD became the sliding surface.

Sample No. 13 suffered remarkable plastic deformation because the surface layer is excessively thick. This suggests that the lower layer with a high hardness does not produce its effect.

Sample No. 14 suffered film peeling and seizure. A probable reason for this is that the hard lower layer is so thick as to cause cracking from which film peeling propagate during the sliding test. By contrast, Samples Nos. 4, 8-12, and 15 attained good seizure resistance and low frictional coefficient while keeping low the amount of plastic deformation.

Sample No. 16, in which the lower layer was formed by CVD and the upper layer was formed by PVD, was unsatisfactory in plastic deformation, seizure resistance, and frictional coefficient.

TABLE 1

| Sample No. | Film of lower layer | Bias voltage applied when film is formed by PVD (−V) | Thickness of lower layer (μm) | Hardness (GPa) | Young's modulus (GPa) | Upper layer | Gas pressure for CVD (Pa) | Thickness of upper layer (μm) | Hardness (GPa) | Young's modulus (GPa) | Amount of plastic deformation under a load of 1000 mN (μm) | Seizure starting distance (m), max. 5000 m. | Frictional coefficient | Overall rating |
|---|---|---|---|---|---|---|---|---|---|---|---|---|---|---|
| 1 | PVD film | 250 | 1.25 | 29 | 298 | none | — | — | — | — | 1.65 | 5000c | 0.12 | X |
| 2 | none | — | — | — | — | CVD film | 4.5 | 6.41 | 15 | 186 | 2.04 | 1789 | 0.098 | X |
| 3 | PVD film | 80 | 0.13 | 26 | 271 | CVD film | 4.0 | 5.34 | 16 | 190 | 1.97 | 1905 | 0.099 | X |
| 4 | PVD film | 100 | 0.36 | 29 | 303 | CVD film | 4.5 | 3.25 | 15 | 183 | 1.67 | 5000c | 0.098 | ○ |
| 5 | PVD film | 250 | 1.25 | 29 | 298 | CVD film | 1.0 | 2.33 | 22 | 250 | 1.54 | 5000c | 0.123 | X |
| 6 | PVD film | 20 | 3.56 | 16 | 204 | CVD film | 3.0 | 2.51 | 17 | 193 | 2.13 | 2358 | 0.101 | X |
| 7 | PVD film | 50 | 3.23 | 22 | 258 | CVD film | 4.5 | 0.73 | 15 | 188 | 1.73 | 3788 | 0.095 | X |
| 8 | PVD film | 50 | 3.23 | 22 | 258 | CVD film | 8.2 | 8.45 | 6 | 83 | 1.87 | 5000c | 0.064 | ○ |
| 9 | PVD film | 50 | 3.23 | 22 | 258 | CVD film | 4.5 | 2.66 | 15 | 188 | 1.69 | 5000c | 0.089 | ○ |
| 10 | PVD film | 50 | 3.23 | 22 | 258 | CVD film | 4.5 | 1.25 | 19 | 221 | 1.58 | 5000c | 0.097 | ○ |
| 11 | PVD film | 140 | 3.01 | 34 | 325 | CVD film | 5.0 | 4.92 | 14 | 174 | 1.59 | 5000c | 0.095 | ○ |
| 12 | PVD film | 160 | 2.51 | 36 | 340 | CVD film | 6.5 | 8.53 | 11 | 148 | 1.61 | 5000c | 0.089 | ○ |
| 13 | PVD film | 230 | 3.22 | 28 | 294 | CVD film | 6.0 | 11.43 | 12 | 157 | 2.56 | 1549 | 0.086 | X |
| 14 | PVD film | 60 | 4.51 | 25 | 255 | CVD film | 5.5 | 3.56 | 13 | 166 | 1.92 | 974 | 0.088 | X |
| 15 | PVD film | 200 | 1.14 | 28 | 271 | CVD film | 2.0 | 2.18 | 19 | 238 | 1.58 | 5000c | 0.099 | ○ |
| 16 | CVD film | (3.0 Pa) | 3.66 | 18 | 189 | PVD film | (50 V) | 2.84 | 22 | 249 | 1.78 | 3371 | 0.124 | X |

What is claimed is:

1. A diamond-like carbon film comprising at least two layers, one layer being a lower layer of diamond-like carbon closest to a substrate and the other layer being an upper layer of diamond-like carbon placed on the lower layer and being further from the substrate, wherein the lower layer is formed by physical vapor deposition and has a hardness no lower than 20 GPa and no higher than 45 GPa, a Young's modulus no lower than 250 GPa and no higher than 450 GPa, and a thickness no smaller than 0.2 μm and no larger than 4.0 μm, and the upper layer is formed by chemical vapor deposition and has a hardness no lower than 5 GPa and lower than 20 GPa, a Young's modulus no lower than 60 GPa and no higher than 240 GPa, and a thickness no smaller than 1.0 μm and no larger than 10 μm, and wherein said diamond-like carbon film has a plastic deformation under a load of 1000 mN of 1.58-1.87 μm.

2. A sliding part having its sliding surface coated with the diamond-like carbon film of claim 1.

3. A method for producing the sliding part according to claim 2, said method comprising forming on a sliding surface the lower layer of diamond-like carbon by physical vapor deposition and forming thereon the upper layer of diamond-like carbon by chemical vapor deposition.

4. The method for producing the sliding part according to claim 3, wherein the formation of the lower layer and the upper layer is performed continuously and in a same chamber.

5. The diamond-like carbon film according to claim 1, wherein the lower layer has a hardness no lower than 20 GPa and no higher than 40 GPa, a Young's modulus no lower than 250 GPa and no higher than 400 GPa, and a thickness no smaller than 0.3 μm and no larger than 3.5 μm, and the upper layer has a hardness no lower than 10 GPa and no higher than 18 GPa, a Young's modulus no lower than 120 GPa and no higher than 230 GPa, and a thickness no smaller than 2.0 μm and no larger than 8 μm.

6. The diamond-like carbon film according to claim 1, wherein the film further comprises a third layer placed on the surface of the upper layer that is further from the substrate, said third layer having a hardness lower than that of the upper layer.

7. The diamond-like carbon film according to claim 1, wherein the film further comprises an intermediate layer between the lower layer and the substrate, said intermediate layer being formed from any of Cr, Ti, V, W, C and compounds thereof.

8. The diamond-like carbon film according to claim 1, wherein the formation of the lower layer and the upper layer is performed continuously and in a same chamber.

9. The diamond-like carbon film according to claim 1, wherein said diamond-like carbon film has a plastic deformation under a load of 1000 mN of 1.58-1.69 μm.

10. A method for producing the diamond-like carbon film according to claim 1, said method comprising forming on a siding part the lower layer of diamond-like carbon by physical vapor deposition and forming thereon the upper layer of diamond-like carbon by chemical vapor deposition.

11. The method for producing the diamond-like carbon film according to claim 10, wherein the formation of the lower layer and the upper layer is performed continuously and in a same chamber.

* * * * *